United States Patent
Noviello et al.

(10) Patent No.: US 11,263,373 B2
(45) Date of Patent: Mar. 1, 2022

(54) PREDICTIVE MACHINING FOR FORGING DISTORTIONS

(71) Applicant: Autodesk, Inc., San Rafael, CA (US)

(72) Inventors: Daniel Mario Noviello, London (GB); Fikret Kalay, Saint-Jean-Bonnefonds (FR); Akmal Ariff Bin Abu Bakar, London (GB)

(73) Assignee: Autodesk, Inc., San Rafael, CA (US)

(*) Notice: Subject to any disclaimer, the term of this patent is extended or adjusted under 35 U.S.C. 154(b) by 448 days.

(21) Appl. No.: 16/257,729

(22) Filed: Jan. 25, 2019

(65) Prior Publication Data

US 2020/0242204 A1 Jul. 30, 2020

(51) Int. Cl.
G06F 30/23 (2020.01)
G06T 17/20 (2006.01)
G06F 30/17 (2020.01)

(52) U.S. Cl.
CPC .............. *G06F 30/23* (2020.01); *G06F 30/17* (2020.01); *G06T 17/205* (2013.01)

(58) Field of Classification Search
None
See application file for complete search history.

(56) References Cited

U.S. PATENT DOCUMENTS

| 8,645,086 B1* | 2/2014 | Castle | G06F 30/23 |
| | | | 702/42 |
| 2003/0225476 A1* | 12/2003 | Mika | G06F 30/23 |
| | | | 700/160 |
| 2006/0050987 A1* | 3/2006 | Shimada | G06T 17/20 |
| | | | 382/285 |
| 2016/0054725 A1* | 2/2016 | Simon | G05B 19/404 |
| | | | 29/557 |

(Continued)

FOREIGN PATENT DOCUMENTS

| EP | 3296899 A1 * | 3/2018 | ............. G06F 30/00 |
| EP | 3316156 A1 * | 5/2018 | ............... G06N 5/04 |

OTHER PUBLICATIONS

Jin, Yu-an et al. "Optimization of tool-path generation for material extrusion-based additive manufacturing technology", Additive Manufacturing 1-4 (2014) 32-47 (Year: 2014).*

(Continued)

*Primary Examiner* — Kamini S Shah
*Assistant Examiner* — Russ Guill
(74) *Attorney, Agent, or Firm* — Fish & Richardson P.C.

(57) ABSTRACT

Methods, systems, and apparatus, including computer programs encoded on a computer storage medium, for predictive machining for forging distortions. In one aspect, a method includes obtaining a mesh model of a machined part to be machined from a forged part and residual stress field data for the forged part, where the mesh model includes multiple nodes corresponding to at least one boundary of the (Continued)

machined part, updating the mesh model by applying the residual stress field data to the multiple nodes corresponding to the at least one boundary to change positions of the multiple nodes in the mesh model, repeating the updating until an amount of change to each of the positions of the multiple nodes in the mesh model satisfies a correction criteria, and providing the compensated mesh model for use in machining the machined part from the forged part.

20 Claims, 6 Drawing Sheets

(56) References Cited

U.S. PATENT DOCUMENTS

2016/0246908 A1* 8/2016 Komzsik ................. B29C 67/00
2016/0321384 A1* 11/2016 Pal ......................... B33Y 50/02

OTHER PUBLICATIONS

Liu, C.R. et al. "Finite element analysis of the elect of sequential cuts and tool-chip friction on residual stresses in a machined layer", International Journal of Mechanical Sciences 42 (2000) 1069-1086 (Year: 2000).*

Boussetta, Ramzy et al. "Adaptive remeshing based on a posteriori error estimation for forging simulation", Comput. Methods Appl. Mech. Engrg. 195 (2006) 6626-6645 (Year: 2006).*

Berend Dekena et al., "Simulation of residual stress related part distortion," 2013, New Production Technologies in Aerospace Industry Proceedings of the 4th Machining Innovations Conference, Hannover, Sep. 2013, 10 pages (Year: 2013).*

S. Dreier et al., "Simulation based reduction of residual stress related part distortion," 2016, Materialwissenschaft und Werkstofftechnik, vol. 47, Issue 8, 9 pages (Year: 2016).*

Kong Ma et al., "Modeling of residual stress and machining distortion in aerospace components," 2010, Air Force Research Laboratory, 43 pages (Year: 2010).*

Mei Zhongyi et al., "Analyzing distortion of aircraft structural part in NC machining based on FEM simulation," 2010, 2010 International Conference on Mechanical and Electrical Technology, 5 pages (Year: 2010).*

Arbtip Dheeravongkit et al., "Inverse adaptation of a Hex-dominant mesh for large deformation finite element analysis," 2007, Computer-aided Design, vol. 39, pp. 427-438 (Year: 2007).*

T.D. Marusich et al., "Residual stress prediction for part distortion modeling," 2006, technical Paper 2006-01-3171, SAE International, 5 pages (Year: 2006).*

D. Hornbach et al., "Development of machining procedures to minimize distortion during manufacture," 1998, Proceedings of the 17th Heat Treating Society Conference and Exposition, 7 pages (Year: 1998).*

D. Dye et al., "Modelling and measurement of residual stresses in a forged IN718 superalloy disc," 2004, Superalloys 2004, 8 pages (Year: 2004).*

T.D. Marusich et al., "Finite element modeling of part distortion," 2008, ICIRA 2008 Part II, 10 pages (Year: 2008).*

Antonio Huerta et al., "Adaptive finite element strategies based on error assessment," 1999, International Journal for Numerical Methods in Engineering, vol. 46, pp. 1803-1818 (Year: 1999).*

Long-yuan Li et al., "Adaptive finite element methods: a review," 1997, Applied Mechanics Review, vol. 50, issue 10, pp. 581-591 (Year: 1997).*

Alvise et al., "Modelling of Part Distortion Due to Residual Stresses Relaxation: an Aeronautical Case Study," Procedia CIRP, 2015, 31:447-452.

Jayanti et al., "Predictive Modeling for Tool Deflection and Part Distortion of Large Machined Components," Procedia CIRP, 2013, 12:37-42.

* cited by examiner

PREDICTIVE MACHINING FOR FORGING DISTORTIONS

BACKGROUND

This specification relates to computer aided design and manufacture of physical structures using subtractive manufacturing systems and techniques.

Computer Aided Design (CAD) software and Computer Aided Manufacturing (CAM) software have been developed and used to generate three-dimensional (3D) representations of parts and to manufacture the physical structures of those parts, e.g., using Computer Numerical Control (CNC) manufacturing techniques.

Subtractive manufacturing refers to any manufacturing process where 3D parts are created from stock material (generally a "blank" or "workpiece" that is larger than the 3D part) by cutting away portions of the stock material. Such manufacturing processes typically involve the use of multiple CNC machine cutting tools in a series of operations. 3D parts manufactured using CNC manufacturing techniques can include, for example, turbine blades and other components for aerospace applications and/or power generation applications.

In some implementations, the stock material used for machining a 3D part can be a forged part that includes residual stresses that can occur due to material flow during a forging or stamping operation, as well as from quenching or other heat treatments in post-forging processes. The residual stresses can cause the forged part to relieve stress by physically distorting as material is removed from the forged part during a manufacturing process, e.g., during a CNC machining process.

Residual stresses in the forged part can increase difficulty in predicting an accurate tool-path for the CNC machine to follow that stays within the material volume of the forged part and results in a machined part that conforms to tolerances. The process of determining the residual stresses inside the forged part can be performed by using simulation methods like finite element analysis, heat transfer analysis, and microstructure prediction methods.

SUMMARY

This specification describes technologies relating to automatically generating compensated machining tool paths which take into consideration the residual stress field data for a forged part from which a machined part is to be machined, thereby reducing distortion.

In general, at least one innovative aspect of the subject matter described in this specification can be embodied in methods that include the actions of obtaining a mesh model of a machined part to be machined from a forged part and residual stress field data for the forged part, where the mesh model multiple nodes corresponding to at least one boundary of the machined part to be machined from the forged part, updating the mesh model for the machined part to be machined from the forged part by applying the residual stress field data for the forged part to the multiple nodes corresponding the at least one boundary of the machined part to be machined from the forged part to change positions of the multiple nodes in the mesh model, repeating the updating until an amount of change to each of the positions of the multiple nodes in the mesh model satisfies a correction criteria, and providing the compensated mesh model for use in machining the machined part from the forged part.

Other embodiments of this aspect include corresponding systems, apparatus, and computer programs, configured to perform the actions of the methods, encoded on computer storage devices.

These and other embodiments can each optionally include one or more of the following features. In some implementations, obtaining the mesh model of the machined part to be machined from the forged part includes receiving a computer-aided design (CAD) model of the machined part to be machined from the forged part, and converting the CAD model into the mesh model.

In some implementations, obtaining the residual stress field data for the forged part includes receiving residual stress field data calculated for the forged part, and producing a residual stress mesh model from the residual stress field data.

In some implementations, updating the mesh model for the machined part to be machined from the forged part by applying the residual stress field data for the forged part includes interpolating the residual stress field data in the residual stress mesh model into the mesh model of the machined part.

In some implementations, updating the mesh model includes, for each node of the multiple nodes of the mesh model, determining a difference vector between a position of the node of the mesh model and a respective changed position of the node after applying the residual stress field data to the mesh model, and updating the position of the node in the mesh model to compensate for the difference vector. The amount of change to each of the positions of the multiple nodes in the mesh model that satisfies the correction criteria can have a magnitude less than a threshold value.

In some implementations, providing the compensated mesh model for use in machining the machined part from the forged part includes producing tool paths for a computer controlled manufacturing, e.g., a computer-numerically controlled (CNC) system to manufacture the machined part from the forged part, where the tool paths are produced from the compensated mesh model or from a CAD model produced from the mesh model.

In some implementations, providing the compensated mesh model for use in machining the machined part from the forged part includes determining, from the compensated mesh model including multiple nodes, an initial tool path including multiple sequential sub-paths, including a first sub-path connecting a first node position to a second node position and a second sub-path connecting the second node position to a third node position, and where each sub-path of the multiple sequential sub-paths defines a region of the forged part that is to be removed from the forged part. For each sub-path of the plurality of sequential sub-paths of the initial tool path: determining, from the compensated mesh model and the residual stress field data of the forged part, a respective deflection vector for each node position of the multiple nodes, where the deflection vector is a difference between an original position of the node before the sub-path is completed to a deflected position of the node after the sub-path is completed, and generating, a modified sub-path for each subsequent sub-path of the multiple sequential sub-paths, and generating, a modified tool path from the multiple modified sub-paths.

In some implementations, determining the deflection vector includes performing a finite element analysis simulation of a machining process using the initial tool path on the forged part.

In some implementations, the modified tool path is provided to a computer-controlled manufacturing system to manufacture the machined part from the forged part. The compensated mesh model can be provided for machining of the machined part from the forged part by converting the compensated mesh model into a CAD model of the machined part to be machined from the forged part.

Other embodiments of this aspect include a system including a data processing apparatus including at least one hardware processor, and a non-transitory computer-readable medium encoding instructions for a computer-numerically-controlled subtractive manufacturing machine, the instructions being configured to cause the data processing apparatus to obtain a mesh model of a machined part to be machined from a forged part and residual stress field data for the forged part, where the mesh model includes multiple nodes corresponding to at least one boundary of the machined part to be machined from the forged part, update the mesh model for the machined part to be machined from the forged part by applying the residual stress field data for the forged part to the multiple nodes corresponding to the at least one boundary of the machined part to be machined from the forged part to change positions of the multiple nodes in the mesh model, repeat the updating until an amount of change to each of the positions of the multiple nodes in the mesh model satisfies a correction criteria, and provide the compensated mesh model for use in machining the machined part from the forged part using the computer-numerically-controlled subtractive manufacturing machine.

Particular embodiments of the subject matter described in this specification can be implemented to realize one or more of the following advantages. By automatically generating compensated machining tool paths that take into consideration the residual stresses of the forged parts from which the machined parts are to be machined, distortions of the final machined part are reduced and accuracy of the machined part with respect to an intended shape is improved. The location, direction, and magnitude of residual stress fields can be provided as input to a system that can generate a machine tool strategy that minimizes deformation of a final machined product, in part by performing tool path prediction based on residual stress data. The automatic adaptive tool path generation can reduce the need of a machinist to compensate for distortions that arise during the machining process, reducing machining time and saving material and costs by improving yield and throughput. By iteratively optimizing the compensated machine tool strategy before beginning an actual manufacturing process, tolerances can be improved in the final product compared to the tolerances produced by a trial and error approach. Additionally, a tool path followed by a CNC machine can be highly dependent on material removal parameters like tool size, depth of cut, feeds and speeds, and other similar machine variables. The tool-path can also be path-dependent, e.g., the sequence of machining operations is important to achieve a desirable result. The automatic adaptive tool path generation can generate a tool path strategy without a need for a manual, trial-and-error, iterative approach to find an optimized tool path for machining a machined part from forged part having a residual stress field.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

Distortion of parts during machining can result in costly increases in scrap rates. Machining distortion can be caused by several mechanisms, for example, by an application of force, by temperature fluctuations during the machining process itself, and by release of residual stresses trapped in the part. In the forging process for a part, nonlinear deformation and rapid non-uniform cooling experienced by the part can introduce residual stresses in the part in comparison with other manufacturing methods, which can result in forged parts having large deformations during subsequent machining processes.

In general, a process of acquiring the compensated mesh model is based on a mesh model optimization algorithm and utilizes a finite element solver. Firstly, an initial estimate of the compensated shape is placed in a residual stress field for the forged part. An initial mesh model can be represented as a surface triangular mesh that is then used to generate a 3D tetrahedral mesh. The residual stress field for the forged part can be represented in a dissimilar 3D mesh of the residual stress field data. The initial mesh model can be placed within the residual stress field for the forged part by interpolating the residual stress field from its 3D tetrahedral mesh into the initial mesh model's tetrahedral mesh.

Once the field transfer is performed, the release of the residual stresses in the initial mesh model are simulated using a finite element analysis solver. This provides a deformed mesh model that can be compared with the machined part. The initial mesh model, deformed mesh model, and compensated mesh model can be generated using a same triangular surface mesh but with respective nodes displaced differently such that a difference between the deformed mesh model and the initial mesh model can be represented as a set of displacement vectors. The set of displacement vectors can be used to displace the nodes in the initial mesh model to generate a compensated mesh model, and the process of applying the residual stress field data to the compensated mesh model to generate a deformed mesh model can be performed iteratively until the set of displacement vectors meets correction criteria. The compensated mesh model can be provided to a machining system for machining the machined part from the forged part. The compensated mesh model can be, for example, converted into a computer-aided design (CAD) model that can be provided to a machining system to generate a tool path using a tool path generation software package for machining the machined part from the forged part. In another example, the tool path is generating directly from the compensated mesh model using a tool path generation software package for machining the machined part from the forged part.

In some implementations, a tool path optimization can be performed. A tool path can be generated using, for example, POWERMILL® machining software (available from Autodesk, Inc. of San Rafael, Calif.) or another similar software package. A tool path can be defined based in part on a set of boundaries of the machined part, where a boundary of the machined part defines an outer surface of the machined part and can be modeled, using the mesh model, by multiple nodes connected by triangular mesh. The one or more boundaries defined by the tool path can be tracked as a simulated machining process occurs such that the tool path can be adjusted to follow each boundary as the forged part deforms, e.g., due to residual stress fields releasing due to the machining process.

The movement of one or more boundaries of the tool path during the machining process can be predicted, for example, by simulating the machining process using an explicit finite element solver. In some implementations, the machining simulation is implemented as selective element deletion, but more detailed schemes can be employed to simulate the forces applied and temperature rise experienced during the machining.

In some implementations, an initial tool path can be mapped to the nodes of a mesh model used to simulate the machining rather than using absolute Cartesian coordinate values of the machining system. The mapping of the tool path onto the nodes of the mesh model can be done via any suitable nearest neighbor search algorithm, for example, a KD-tree algorithm. The tool path is tied to the indices of the nodes of the mesh model (e.g., the compensated mesh model) such that the tool path used in the explicit finite element solver can interpolate between the position of the moving nodes as each sub-path is machined into the forged part via linear interpolation.

In some implementations, the position of the tool path can be recorded in Cartesian coordinates and can be used as the compensated tool path in a physical machining process, e.g., on a computer numerical control (CNC) system.

Example Operating Environment

Figure 1:
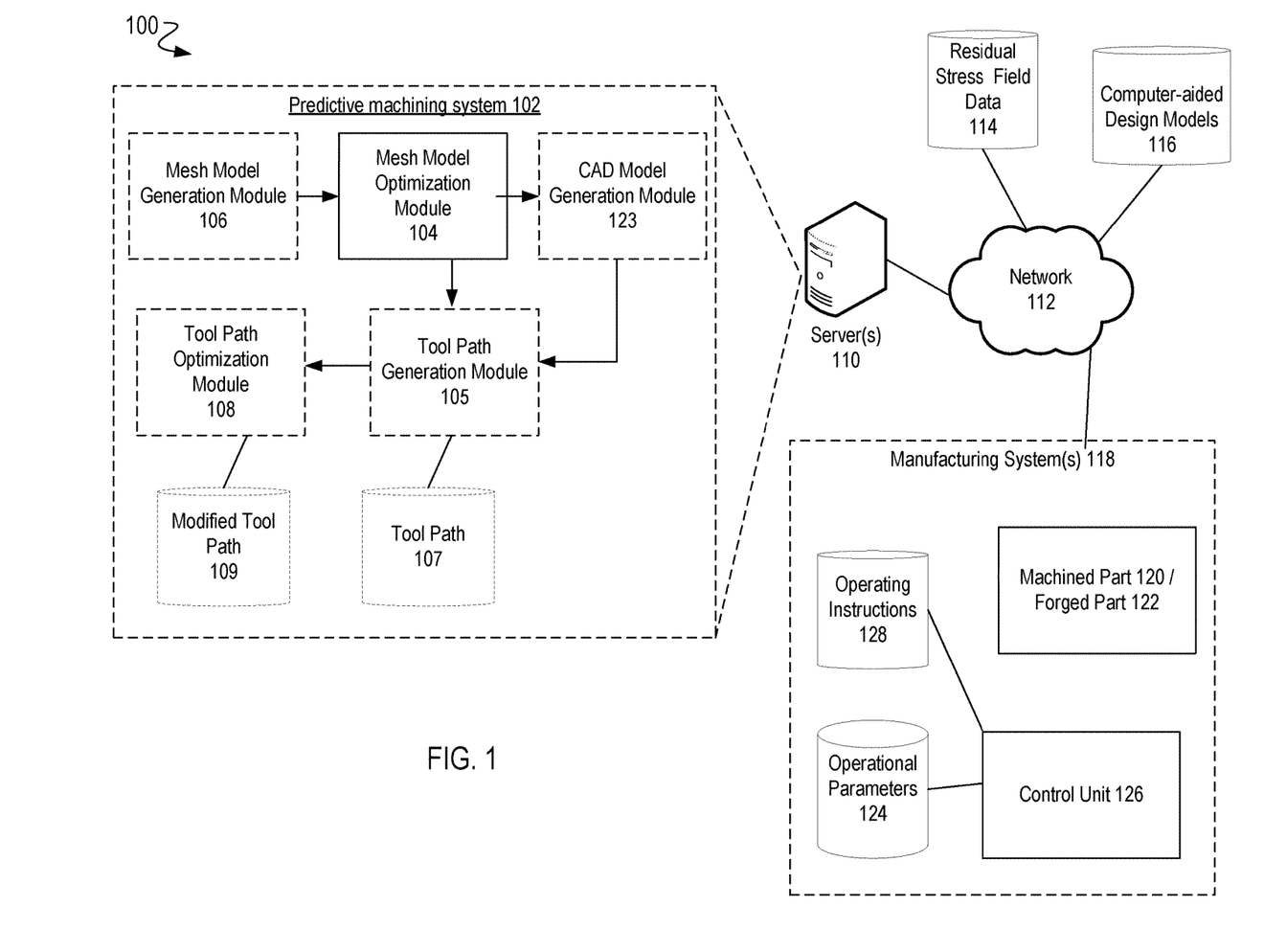
FIG. 1 shows a block diagram of an example of an operating environment for a predictive machining system.

FIG. 1 shows a block diagram of an example of an operating environment 100 for a predictive machining system 102. The predictive machining system 102 for compensating for a residual stress field in a forged part from which a machined part is to be machined includes a mesh model optimization module 104. The predictive machining system 102 can additionally include a mesh model generation module 106 and a tool path optimization module 108.

Predictive machining system 102 can be hosted on one or more servers 110. Server(s) 110 includes one or more hardware processors and memory. The one or more hardware processors can each include multiple processor cores. The memory can include both volatile and non-volatile memory, such as Random Access Memory (RAM) and Flash RAM. The server(s) 110 can include various types of computer storage media and devices, to store instructions of program(s) that run on the processor.

Server(s) 110 can be in data communication with a network 112, where network 112 can be, for example, a local area network (LAN), a wide area network (WAN), the Internet, or a combination thereof. In some implementations, server(s) 110 can access one or more databases for storing data through the network 112, for example, residual stress field data 114 and computer-aided design (CAD) models 116.

Network 112 can be in data communication with one or more manufacturing systems 118. Manufacturing system(s) 118 can be, for example, a computer numerical control (CNC) manufacturing machine, such as a multi-axis, multi-tool milling machine. Manufacturing system(s) 118 can be configured to machine a machined part 120 using semi-automatic and/or fully-automatic operation from a forged part 122.

A forged part 122, as used herein, is a workpiece that is fabricated using a manufacturing process that can result in build-up of residual stress fields within the forged part, e.g., involving the shaping of metal using localized compressive forces. In some implementations, a forged part can be manufactured using stamping processes where the material to be stamped is at an elevated temperature to enable plastic deformation and which results in build-up of residual stress fields within the forged part. Other manufacturing processes that can be used and may result in build-up of residual stress can include hot or cold rolling, and cold working, e.g., where a part is deformed at a low temperature. The forged part is the unrefined piece that is then machined, e.g., by removing portions of material from the forged part using subtractive manufacturing, to yield a machined part.

In some implementations, a workpiece that is fabricated using manufacturing processes, e.g., by casting, metal additive manufacturing, or another technique for manufacturing metal workpieces, can include residual stresses resulting from the manufacturing process. For example, cooling processes used on workpieces that are manufactured using a casting process can induce residual stresses within the workpiece. In another example, a layer-by-layer additive manufacturing process for a metal workpiece can accumulate residual stresses within the workpiece. The techniques described herein with respect to generating compensated mesh models and modified toolpaths can therefore be applied to workpieces that are fabricated by these alternative manufacturing processes.

The forged part 122 can have an associated residual stress field data 114, where the residual stress field in the forged part can be generated by a large non-uniform deformation experienced by the material of the forged part, for example, during a forging and/or a stamping process. Additionally, residual stress fields can arise due to non-uniform cooling of the forged part after a hot forging process on the forged part is completed. In some embodiments, the material of the forged part 122 expands significantly due to high temperatures used in the forging process which can cause compression in an outer layer of the forged part and tension in an inner layer of the forged part because the outer surface of the forged part cools at a higher rate that the inner layer and becomes stiff before the material inside has cooled down. Details of determining residual stress field data 114 for the forged part 122 are described below with reference to FIGS. 2A and 2B.

A machined part 120 is the finished part that results from machining the forged part, where the machined part can be, for example, a blade or blisk for a turbine used in aerospace applications or power generation. The forged part and machined part can be composed of a variety of metals, ceramics, or the like.

Mesh model optimization module 104 can receive, as input, an initial mesh model for a machined part 120 to be machined from a forged part 122 having an associated residual stress field, e.g., resulting from a forging process. An initial mesh model provided to the mesh model optimization module 104 can be, for example, represented as a surface triangular mesh which is then used to generate a 3D tetrahedral mesh, where each node of the 3D tetrahedral mesh corresponds to a point on a surface boundary or in the volume of the machined part.

In some implementations, mesh model generation module 106 can receive a CAD model 116 for a machined part 120 that is to be machined from a forged part 122. A CAD model 116 can be a two- or three-dimensional digital representation of a machined part to be machined from a forged part. The mesh model generation module 106 can generate a mesh model from the CAD model, for example, using AUTOCAD software (available from Autodesk, Inc. of San Rafael, Calif.) or another similar software package. The mesh model generation module 106 can provide the generated mesh model to the mesh model optimization module 104. Further details of the mesh model optimization module 104 are discussed below with reference to FIGS. 2A and 2B.

Mesh model optimization module 104 can provide, as output, a compensated mesh model, where the compensated mesh model compensates for the residual stress field data 114 associated with the forged part 122. The compensated mesh model can be provided to the manufacturing system(s) 118 which can, for example, convert the compensated mesh model into a CAD model 116 to be used by the manufacturing system(s) 118 in a machining process, or the compensated mesh model can be used to directly generate a tool path using POWERMILL® machining software (available from Autodesk, Inc. of San Rafael, Calif.) or another similar software package.

In some implementations, the mesh model optimization module 104 can provide a compensated mesh model to the tool path generation module 105. The tool path generation module 105 can receive, as input, a compensated mesh model and generate one or more tool paths 107 from the compensated mesh model, where the tool path 107 can be used by manufacturing system(s) 118, e.g., a computer controlled manufacturing system, to manufacture the machined part from the forged part. Tool path generation module 105 can generate a tool path for the compensated mesh model, for example, using POWERMILL® machining software (available from Autodesk, Inc. of San Rafael, Calif.) or another similar software package.

The tool path generation module 105 can determine a tool path 107, in part, based on a set of operational parameters 124 for the manufacturing system(s) 118. Operational parameters can include, for example, range of motion, speed of cut, size of a cutting tool, depth of cut, feeds and speeds, plunge rate, ramp rate, shape of the tool end, coolant flow rate, displacement of material, and the like.

In some implementations, the tool path generation module 105 can provide a tool path 107 for the compensated mesh model to the tool path optimization module 108. The tool path optimization module 108 can receive, as input, a tool path 107 for the compensated mesh model. The tool path optimization module 108 can optimize a tool path 107 for the compensated mesh model to provide a modified tool path 109, as output, to the manufacturing system(s) 118, where the modified tool path 109 can compensate for deflections of the forged part 122 due to releasing residual stress during a manufacturing process. Further details of tool path optimization are discussed below with reference to FIGS. 3A and 3B.

In some implementations, a CAD model generation module 123 can receive, as input, the compensated mesh model and generate, as output, a CAD model of the compensated mesh model to provide to manufacturing system(s) 118 for use in machining the machined part from the forged part. The CAD model generation module 123 can generate a CAD model for the compensated mesh model, for example, using AUTOCAD software (available from Autodesk, Inc. of San Rafael, Calif.) or another similar software package.

In some implementations, the CAD model generation module 123 can provide the CAD model of the compensated mesh model to the tool path generation module 105. The tool path generation module, as described above, receives as input, a CAD model of the machined part 120 to be machined from the forged part 122 and generates, as output, a tool path 107.

The manufacturing system(s) 118 can receive, as input, the modified tool path 109 and generate a set of operating instructions 128 for operating the manufacturing system(s) 118 that translate the modified tool path 109 into digital instructions to be followed by a machining bit on a CNC machine. The manufacturing system(s) 118 can include a control unit 126 that receives operating instructions 128 and controls the operations of the manufacturing system(s) 118 to machine the machined part 120 from the forged part 122.

Compensated Mesh Model

Figure 2A:
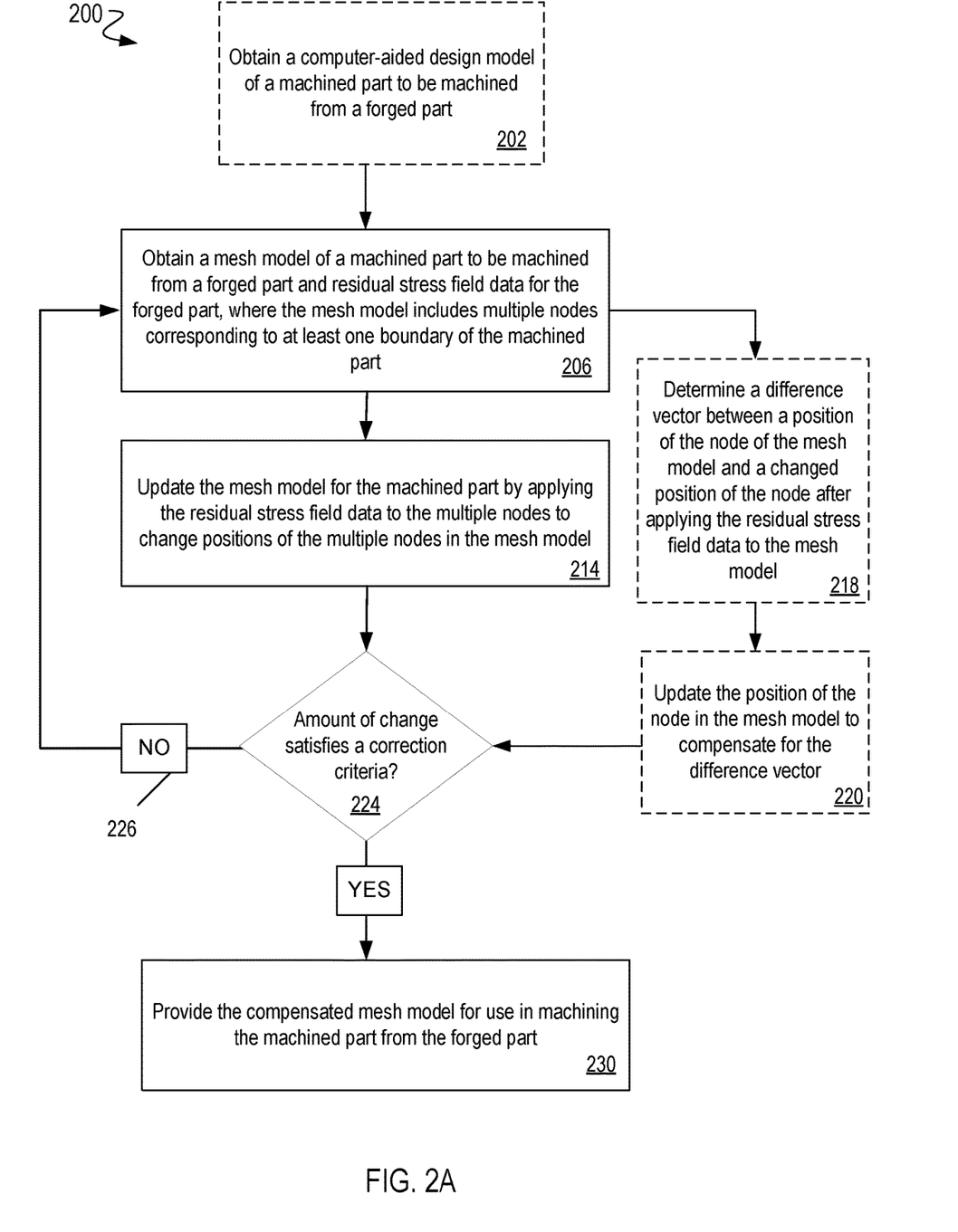
FIG. 2A shows an example of a process to generate a compensated mesh model for machining a machined part from a forged part
Figure 2B:
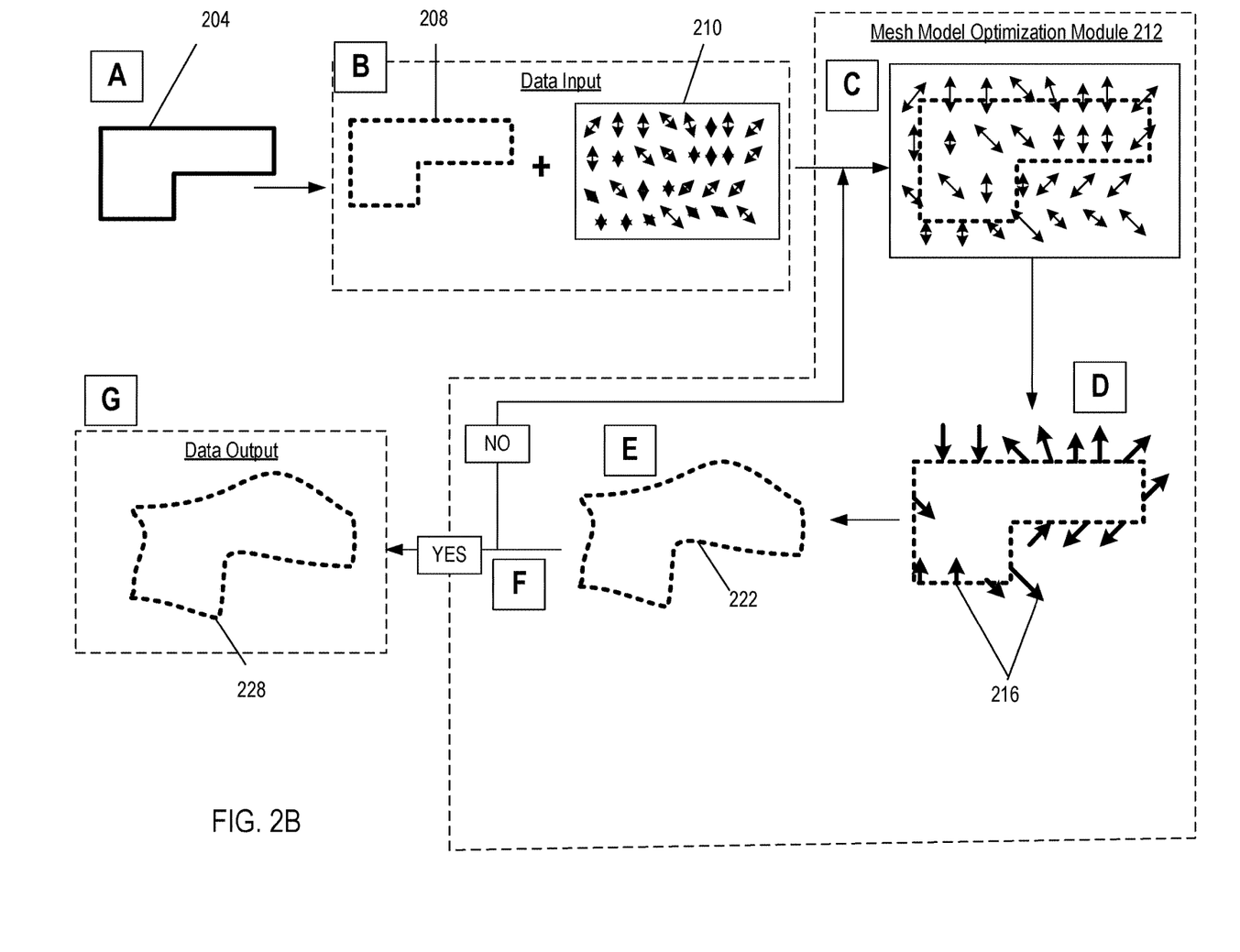
FIG. 2B shows an example of an operating environment for generating a compensated mesh model.

FIGS. 2A and 2B show an example of a flow diagram of a process 200 to generate a compensated mesh model for machining a machined part from a forged part and an example operating environment for generating the compensated mesh model. Referring to FIG. 2A, a CAD model of a machined part to be machined from a forged part is obtained (202). In Stage A of FIG. 2B, the CAD model 204 is obtained of the machined part (e.g., machined part 120) to be machined from a forged part (e.g., forged part 122). A CAD model 204 can be, for example, a two- or three-dimensional model of the machined part that is to be machined from the forged part using, for example, subtractive manufacturing processes. An initial mesh model 208 can be generated from the CAD model 204 using a software package, for example, using AutoCAD. In some implementations, Ruppert's algorithm (Delaunay Refinement) can be used for two dimensional surface meshes. In another example, MESHGEM® software (available from Distene of Bruyères-le-Châtel, France) an be used for generating three-dimensional meshes Referring back to FIG. 2A, an initial mesh model of a machined part to be machined from a forged part and residual stress field data (e.g., residual stress field data 114) for the forged part are obtained, where the initial mesh model includes multiple nodes corresponding to each boundary of the set of boundaries of the machined part (206). A boundary of the machined part defines an outer surface of the machined part and can be modeled, using the mesh model, by multiple nodes connected by triangular mesh.

In FIG. 2B at Stage B, the initial mesh model 208 and residual stress field data 210 are provided as input to a mesh model optimization module 212. The residual stress field data 210 can be determined using empirical methods, simulation, or a combination thereof. In some implementations, finite element analysis can be used to determine areas of residual stress resulting from the forging process for the forged part and generate residual stress data. In another example, residual stress field data can be collected empirically for the forged part, for example, using x-ray diffraction methods. The residual stress field data for the forged part can be represented in a dissimilar 3D mesh of the residual stress field data as a residual stress mesh model.

In FIG. 2A, the initial mesh model 208 for the machined part is updated by applying the residual stress field data 210 to the multiple nodes to change positions of one or more of the multiple nodes in the initial mesh model 208 (214). The mesh model optimization module 212 (e.g., mesh model optimization module 104), in Stage C of FIG. 2B, can receive as input the initial mesh model 208 and residual stress field data 210 for the forged part and apply the residual stress field data to the mesh model.

In some implementations, applying the residual stress field data 210 to the initial mesh model 208 includes interpolating a 3D tetrahedral mesh generated from the residual stress field data 210, e.g., a residual stress mesh model, into a tetrahedral mesh of the initial mesh model 208. Subsequent to interpolating the mesh models, finite element analysis simulation is performed of the residual stress in the initial mesh model being release to determine a changed position of each node of the initial mesh model 208 from an original position of the node of the initial mesh model 208 to generate a changed mesh model.

In some implementations, updating the mesh model 208 for the machined part is performed by determining a difference vector 216 between a position of each node of multiple nodes of the mesh model and a changed position of the node in the changed mesh model after applying the residual stress field data to the mesh model (218), as depicted in Stage D of FIG. 2B. The difference vector 216 includes a direction, e.g., in Cartesian coordinates, and a magnitude representing a displacement of a particular node from an original position of the node in the initial mesh model 208.

The position of each node of the multiple nodes in the initial mesh model is updated to compensate for a respective difference vector for the particular node (220). A correction criteria is determined to be met when the difference vector for each node is determined to be less than a threshold value (224). In some implementations, updating the mesh model to compensate for the difference vector includes moving each node by an amount that is equal in magnitude and opposing in direction to the respective difference vector 216 for the node. For example, if a difference vector 216 has a value in Cartesian coordinates of V=<0.11, 0.4, 0.2>, then the respective node may be moved from an initial position in the initial mesh model 208 to a compensated position in a compensated mesh model 222 by a relative amount <−0.11, −0.4, −0.2>.

In Stage E of FIG. 2B, a compensated mesh model 222 is generated by mesh model optimization module 212, and the mesh model optimization module 212 determines if the compensated mesh model 222 satisfies correction criteria in Stage F. In some implementations, determining if the compensated mesh model 222 satisfies the correction criteria includes applying the residual stress field data 210 for the forged part to the compensated mesh model 222 and determining if a set of difference vectors 216 for the multiple nodes of the compensated mesh model 222 after applying the residual stress field data are each less than a threshold value. More generally, the correction criteria can be satisfied if an amount of change to each of the positions of the multiple nodes in the compensated mesh model is less than a threshold value.

In some implementations, correction criteria is met if each node of the multiple nodes of the compensated mesh model 222 has an updated position after applying the residual stress field data 210 that is less than a tolerance threshold, e.g., 100 microns in absolute distance from the original position.

In some implementations, correction criteria is met when a particular number of nodes of the multiple nodes of the compensated mesh model have respective difference vectors 216 that are of a magnitude less than a threshold magnitude. The particular number of nodes can be, for example, a percentage of the total number of nodes, an absolute number of nodes, or the like. For example, the correction criteria can be met when 85% of the total number of nodes have difference vectors that each have a magnitude less than a threshold magnitude.

Returning to FIG. 2A, a determination is made as to whether an amount of change to the positions of the multiple nodes of the mesh model satisfies correction criteria (224). If the correction criteria are not satisfied, the process is iterated to adjust the compensated mesh model (226). As described with reference to FIG. 2B in Stage F, a determination is made whether the correction criteria is met and, if not, the mesh model optimization module 212 iteratively repeats Stages C-E until the correction criteria is met, e.g., the residual stress field data 210 is applied to the compensated mesh model 222 and the compensated mesh model 222 is updated until the correction criteria is met.

In some implementations, correction criteria can be set based in part on available computational power, cost considerations, or the like. The correction criteria can also be set based on an available precision of the manufacturing system (e.g., based on operational parameters 124 of manufacturing system(s) 118). For example, the correction criteria may be set such that the difference vector magnitude is less than 0.001 mm based on a minimum resolution of a CNC machine that will perform the machining.

If the correction criteria are determined to be satisfied, the compensated mesh model 222 is provided for use in machining the machined part from the forged part (230). In Stage G of FIG. 2B, the data output 228 of the mesh model optimization module 212 can be the compensated mesh model 222. In some implementations, the compensated mesh model 222 can be converted into a different format that is usable by a manufacturing system (e.g., manufacturing system(s) 118) to machine the machined part from a forged part), for example, into a CAD model.

In some implementations, the compensated mesh model 222 can be provided to a tool path optimization module (e.g., tool path optimization module 108) to generate an optimized tool path to machine the machined part from the forged part.

Optimized Tool Path

A simulation of the machining process can be performed using a finite element analysis simulation to model behavior of the forged part during a machining process. The simulation can account for one or more distortions and/or deflections of the forged part with respect to an original position and dimensions of the forged part in the machining system (e.g., a CNC machine) that can occur as each sub-path of a set of sub-paths of the initial toolpath is machined into the forged part during the machining process.

Figure 3A:
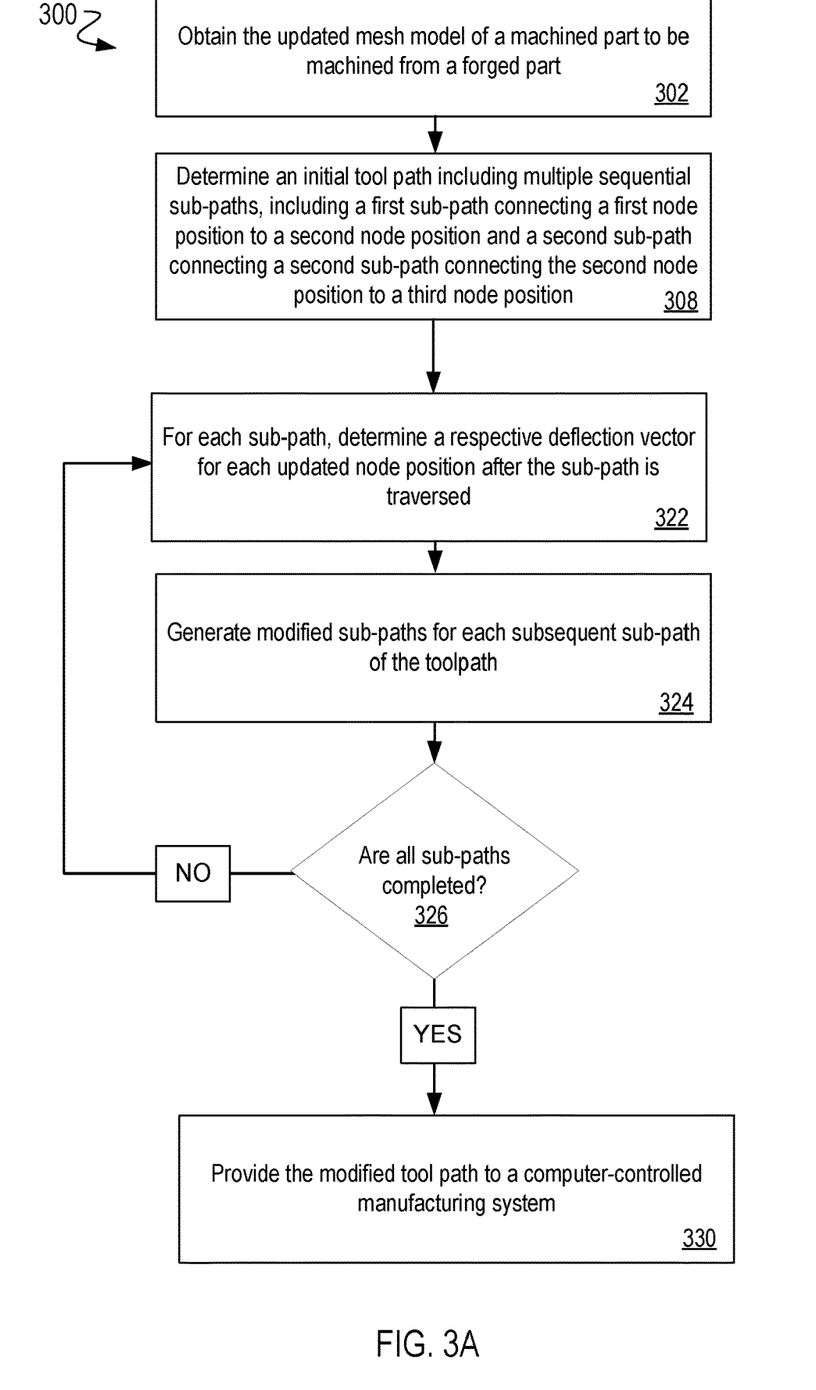
FIG. 3A shows an example of a process to generate an optimized tool path for machining a machined part from a forged part.
Figure 3B:
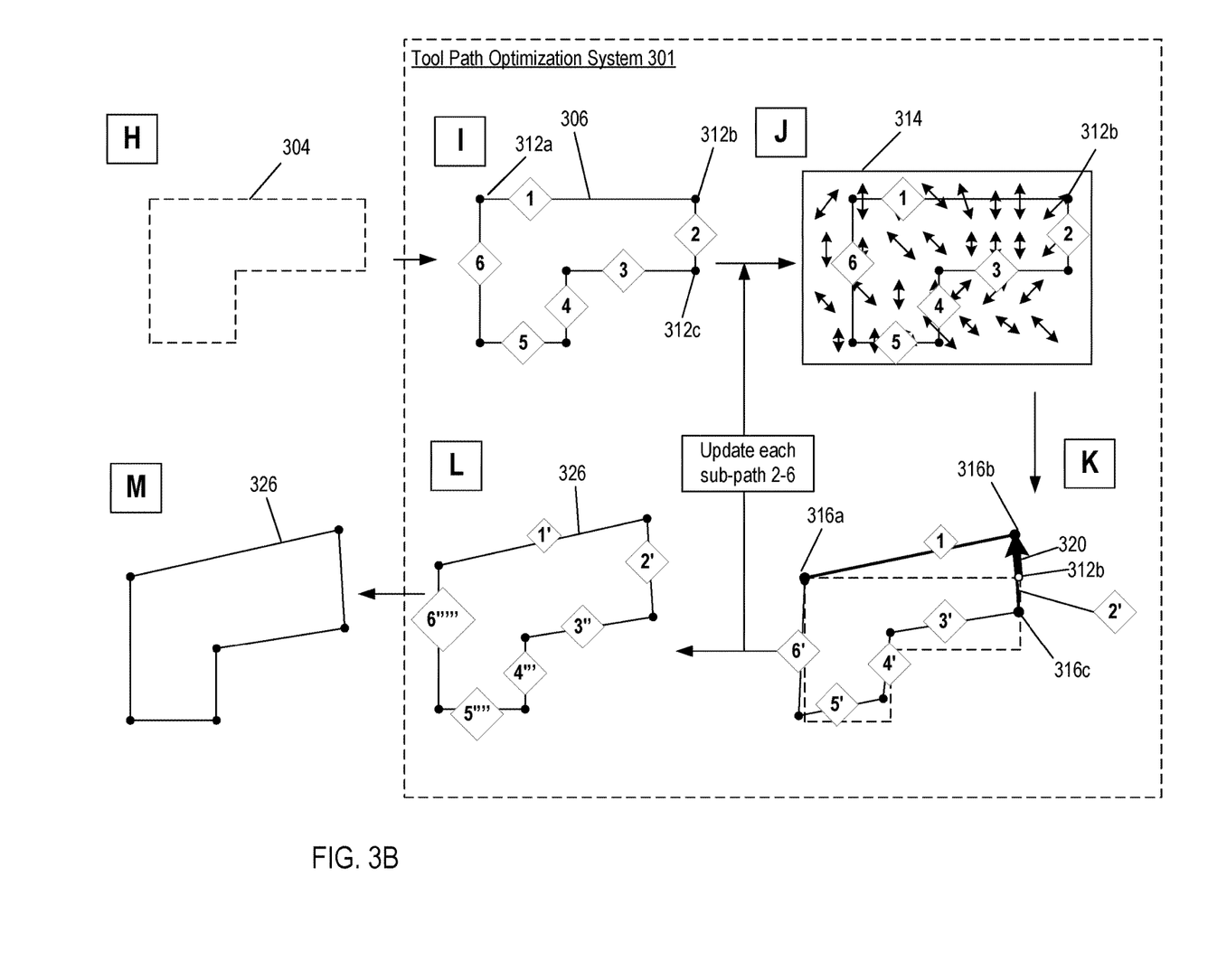
FIG. 3B shows an example of an operating environment for generating an optimized tool path.

In some implementations, a mesh model and residual stress field data can be provided to an optimization tool path module 301 (e.g., optimization tool path model 108). The mesh model and residual stress field data can be transferred into a mesh, for example, a voxel-like mesh or a 3D tetrahedral mesh, and machining of the mesh model can be simulated as material removal using sequential element deletion where the sequence of elements to be deleted from the mesh model follows a particular toolpath. Distortions of the forged part that are introduced through the cutting process can additionally be incorporated into the simulation.

FIGS. 3A and 3B show an example of a flow diagram 300 of a process to generate an optimized tool path for machining a machined part from a forged part and an example operating environment for generating the optimized tool path.

Referring to FIG. 3A, a compensated mesh model of a machined part to be machined from a forged part is obtained (302). A tool path optimization module 301 can receive, as input, a compensated mesh model (e.g., compensated mesh model 222) and/or a CAD model of a machined part that is to be machined from a forged part.

Referring to FIG. 3B in Stage H, a compensated mesh model 304 can be obtained, for example, from the mesh model optimization module 212 where the compensated mesh model 222 is generated as described above with reference to FIGS. 2A and 2B.

An initial tool path 306 including multiple sub-paths can be determined, including a first sub-path connecting a first node position to a second node position and a second sub-path connecting the second node position to a third node position (308), in FIG. 3A. In some implementations, the initial tool path 306 can be generated from a compensated mesh model using, PowerMill® machining software (available from Autodesk, Inc. of San Rafael, Calif.) or another similar software package.

An initial tool path can be generated and adapted to the compensated mesh model such that the initial tool path 306 traces the boundaries defined by the set of nodes of the compensated mesh model. In some implementations, adapting the initial toolpath 306 to the compensated mesh model includes adjusting one or more sub-paths 1,2,3,4,5,6 such that each sub-path 1,2,3,4,5,6 is referenced to one or more nodes of the compensated mesh model. For example, sub-path 1 is adjusted to align with closest nodes of the compensated mesh model, e.g., nodes 312a and 312b. Adapting the initial toolpath 306 can include converting each sub-path from referencing Cartesian coordinates to referencing the nearest nodes of the compensated mesh model to the particular sub-path.

In Stage I of FIG. 3B, the initial tool path 306 is depicted as including 6 sub-paths 1, 2, 3, 4, 5, 6, each sub-path connecting two nodes 312, however, a number of sub-paths for a particular toolpath can vary, e.g., 12 sub-paths, 25 sub-paths, etc. In some implementations, an initial toolpath 306 includes a first sub-path 1 connecting node 312a to a second node 312b and a second sub-path 2 connecting node 312b to a third node 312c. Though depicted in FIG. 3B as straight lines on a two-dimensional plane, each sub-path 1, 2, 3, 4, 5, 6 can include a curved line and can be along a three-dimensional sub-path for machining a three-dimensional machined part.

In Stage J, residual stress field data 314 is applied to the initial tool path 306. In some embodiments, finite element analysis is performed to simulate the machining process including a release of residual stress in the forged part as each sub-path 1, 2, 3, 4, 5, 6 is machined into the forged part. In some implementations, an element deletion method can be used to simulate the machining process where elements that represent the material to be removed along the tool path 305 are deleted in chronological order.

Referring now to Stage K, a machining process is simulated for a first sub-path 1 connecting a first node 312a to a second node 312b, e.g., using element deletion method, and updated node positions 316a, 316b, 316c are determined. One or more node positions 316a, 316b, 316c, etc. may change from respective initial node positions 312a, 312b, 312c, etc. due to deflection of the forged part that can occur when residual stress fields are released during the machining process of the first sub-path 1. For example, after the first sub-path 1 is machined, e.g., through subtractive machining, residual stresses in the forged part may distort such that a set of boundaries of the forged part move relative to an initial set of boundaries of the forged part.

Referring now to FIG. 3A, a respective deflection vector is determined for each updated node position after the first sub-path 1 is traversed (322). In the example, depicted in FIG. 3B at Stage K, a deflection vector 320 is determined for the updated second node position after the first sub-path 1 is traversed from the first node position to the second node position. Determining the deflection vectors can include performing a finite element analysis simulation of the machining process of each respective sub-path on the forged part. As depicted in FIG. 3B in Stage K, the forged part is deflected after the first sub-path 1 is traversed due to release of residual stress fields in the forged part, such that node 312b is moved by a deflection vector 320 to an updated position of node 316b, where the boundaries of the machined part to be machined from the forged part have shifted relative to respective original positions of the boundaries, and where a relative location of the initial second node location 312b is changed to an updated location of the second node 316b. Each node of the multiple nodes of the toolpath 306 is updated to an updated position 316a, 316b, and 316c and so on.

Though depicted in FIG. 3B as a deflection along a single direction (e.g., along a y-axis), deflection vector 320 can be a vector in three-dimensions. Deflection vector 320, as depicted in Stage K of FIG. 3B, is a vector of a particular magnitude indicating the change in location of the second node from an initial position 312b to an updated position 316b.

Modified sub-paths 2', 3', 4', 5', and 6' are generated, including a modified second sub-path 2' from the second node position 312b to the updated third node position 316c (324). In the example depicted in FIG. 3B at Stage K, a modified second sub-path 2' is generated from the second node position 312b to the updated third node position 316c.

Referring back to FIG. 3A, each sub-path of the multiple sub-paths of the toolpath are sequentially simulated, e.g., using element deletion, and the process to generate modified sub-paths after each sub-path is traversed repeats until all sub-paths have been traversed by the simulation (326). The sequential process can include using finite element simulation of the machining process, e.g., by element deletion, to update each node position of the set of subsequent nodes of the multiple nodes in the toolpath and generate the modified sub-paths for those updated node positions. For example, after traversing modified second sub-path 2', all node positions, e.g., node 316c, are updated and modified sub-paths 3", 4", 5", and 6" are generated. Continuing with the example, after traversing modified third sub-path 3", all node positions that are to be subsequently traversed by the simulation are updated and modified sub-paths 4'", 5'", and 6'" are generated. This process continues until modified sub-path 6'" is traversed in the finite element simulation and all modified sub-paths 1, 2', 3", 4'", 5'", 6"" are generated.

The tool path optimization module 301 can determine that all initial sub-paths 1, 2, 3, 4, 5, 6 of the initial tool path 306 have been updated to generate a modified tool path 326 in Stage L. Modified tool path 326 can include multiple modified sub-paths 1', 2', 3", 4'", 5'", 6"". In some implementations, at least one modified sub-path, e.g., sub-path 2' of the multiple sub-paths of modified tool path 326 can be different from a respective initial sub-path, e.g., sub-path 2 of the initial toolpath 306.

In Stage M, the modified tool path 326 can be provided as output from the tool path optimization module 301. Referring to FIG. 3A, the modified tool path is provided to a computer-controlled manufacturing system, e.g., manufacturing system(s) 118, as operating instructions 128 for machining the machined part 120 from the forged part 122 (330). Machining of the machined part from the forged part can be performed, as described with reference to FIG. 1 above.

Figure 4:
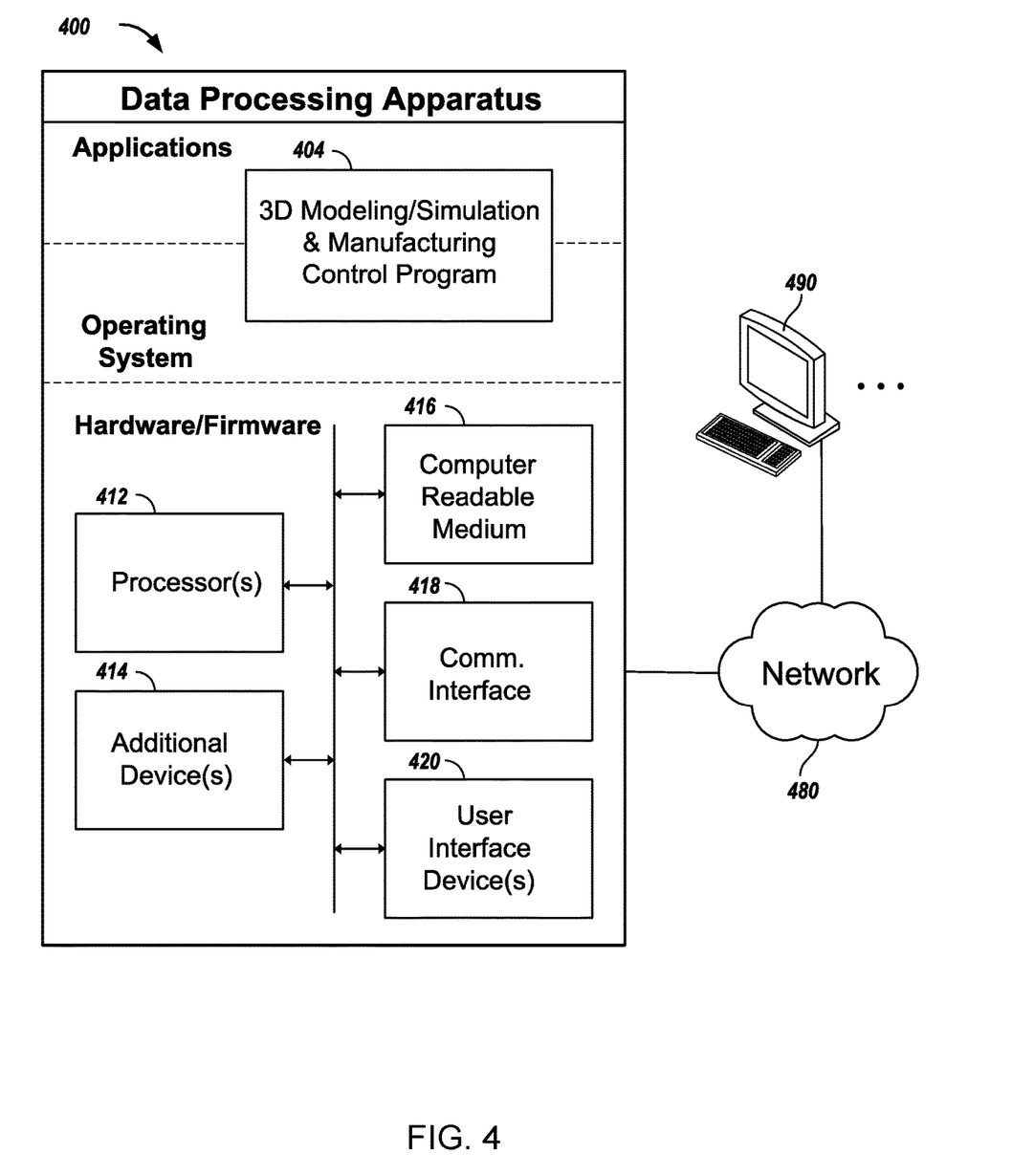
FIG. 4 is a schematic diagram of a data processing system usable to implement the described systems and techniques.

FIG. 4 is a schematic diagram of a data processing system including a data processing apparatus 400, which can be programmed as a client or as a server. The data processing apparatus 400 is connected with one or more computers 490 through a network 480. While only one computer is shown in FIG. 4 as the data processing apparatus 400, multiple computers can be used. The data processing apparatus 400 includes various software modules, which can be distributed between an applications layer and an operating system. These can include executable and/or interpretable software programs or libraries, including tools and services of a 3D modeling/simulation and manufacturing control program 404 that implements the systems and techniques described above. The number of software modules used can vary from one implementation to another. Moreover, the software modules can be distributed on one or more data processing apparatus connected by one or more computer networks or other suitable communication networks.

The data processing apparatus 400 also includes hardware or firmware devices including one or more processors 412, one or more additional devices 414, a computer readable medium 416, a communication interface 418, and one or more user interface devices 420. Each processor 412 is capable of processing instructions for execution within the data processing apparatus 400. In some implementations, the processor 412 is a single or multi-threaded processor. Each processor 412 is capable of processing instructions stored on the computer readable medium 416 or on a storage device such as one of the additional devices 414. The data processing apparatus 400 uses the communication interface 418 to communicate with one or more computers 490, for example, over the network 480. Examples of user interface devices 420 include a display, a camera, a speaker, a microphone, a tactile feedback device, a keyboard, a mouse, and virtual reality and/or augmented reality equipment. The data processing apparatus 400 can store instructions that implement operations associated with the program(s) described above, for example, on the computer readable medium 416 or one or more additional devices 414, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims.

What is claimed is:

1. A method comprising:
    obtaining a mesh model of a machined part to be machined from a forged part and residual stress field data for the forged part, wherein the mesh model comprises multiple nodes corresponding to at least one boundary of the machined part to be machined from the forged part;
    updating the mesh model for the machined part to be machined from the forged part to generate a compensated mesh model by applying the residual stress field data for the forged part to the multiple nodes corresponding to the at least one boundary of the machined part to be machined from the forged part to change positions of the multiple nodes in the mesh model,
        wherein updating the mesh model for the machined part to be machined from the forged part by applying the residual stress field data for the forged part comprises interpolating the residual stress field data into the mesh model of the machined part;
    repeating the updating until an amount of change to each of the positions of the multiple nodes in the mesh model satisfies a correction criteria for the compensated mesh model;
    determining, from the compensated mesh model, an initial tool path comprising a plurality of sequential sub-paths, including a first sub-path connecting a first node position to a second node position and a second sub-path connecting the second node position to a third node position, and wherein each sub-path of the plurality of sequential sub-paths defines a region of the forged part that is to be removed from the forged part;
    for each sub-path of the plurality of sequential sub-paths of the initial tool path:
        determining, from the compensated mesh model and the residual stress field data of the forged part, a respective deflection vector for each node position of the multiple nodes, wherein the deflection vector is a difference between an original position of the node before the sub-path is completed to a deflected position of the node after the sub-path is completed; and
        generating, a modified sub-path for each subsequent sub-path of the plurality of sequential sub-paths;
    generating, a modified tool path from the plurality of modified sub-paths; and
    providing, the modified tool path for use in machining the machined part from the forged part.

2. The method of claim 1, wherein obtaining the mesh model of the machined part to be machined from the forged part comprises:
    receiving a computer-aided design model of the machined part to be machined from the forged part; and
    converting the computer-aided design model into the mesh model.

3. The method of claim 2, wherein obtaining the residual stress field data for the forged part further comprises:
    receiving residual stress field data calculated for the forged part; and
    producing a residual stress mesh model from the residual stress field data.

4. The method of claim 1, wherein updating the mesh model comprises, for each node of the multiple nodes of the mesh model:
   determining a difference vector between a position of the node of the mesh model and a respective changed position of the node after applying the residual stress field data to the mesh model; and
   updating the position of the node in the mesh model to compensate for the difference vector.

5. The method of claim 1, wherein the amount of change to each of the positions of the multiple nodes in the mesh model that satisfies the correction criteria has a magnitude less than a threshold value.

6. The method of claim 1, wherein providing the compensated mesh model for use in machining the machined part from the forged part comprises:
   producing tool paths for a computer controlled manufacturing system to manufacture the machined part from the forged part, wherein the tool paths are produced from the compensated mesh model or from a CAD model produced from the mesh model.

7. The method of claim 1, further comprising, providing the modified tool path to a computer-controlled manufacturing system to manufacture the machined part from the forged part.

8. The method of claim 1, wherein determining the deflection vector includes performing a finite element analysis simulation of a machining process for each sub-path of the plurality of sequential sub-paths.

9. The method of claim 1, wherein providing the compensated mesh model for machining of the machined part from the forged part comprises converting the compensated mesh model into a computer-aided design model of the machined part to be machined from the forged part.

10. A system comprising:
   a data processing apparatus including at least one hardware processor; and
   a non-transitory computer-readable medium encoding instructions for a computer-numerically-controlled subtractive manufacturing machine, the instructions being configured to cause the data processing apparatus to
      obtain a mesh model of a machined part to be machined from a forged part and residual stress field data for the forged part, wherein the mesh model comprises multiple nodes corresponding to at least one boundary of the machined part to be machined from the forged part;
      update the mesh model for the machined part to be machined from the forged part to generate a compensated mesh model by applying the residual stress field data for the forged part to the multiple nodes corresponding to the at least one boundary of the machined part to be machined from the forged part to change positions of the multiple nodes in the mesh model,
         wherein updating the mesh model for the machined part to be machined from the forged part by applying the residual stress field data for the forged part comprises interpolating the residual stress field data into the mesh model of the machined part;
      repeat the updating until an amount of change to each of the positions of the multiple nodes in the mesh model satisfies a correction criteria for the compensated mesh model;
      determine, from the compensated mesh model, an initial tool path comprising a plurality of sequential sub-paths, including a first sub-path connecting a first node position to a second node position and a second sub-path connecting the second node position to a third node position, and wherein each sub-path of the plurality of sequential sub-paths defines a region of the forged part that is to be removed from the forged part;
      for each sub-path of the plurality of sequential sub-paths of the initial tool path:
         determine, from the compensated mesh model and the residual stress field data of the forged part, a respective deflection vector for each node position of the multiple nodes, wherein the deflection vector is a difference between an original position of the node before the sub-path is completed to a deflected position of the node after the sub-path is completed; and
         generate, a modified sub-path for each subsequent sub-path of the plurality of sequential sub-paths;
      generate, a modified tool path from the plurality of modified sub-paths; and
      provide, the modified tool path for use in machining the machined part from the forged part.

11. The system of claim 10, further comprising a computer-numerically-controlled subtractive manufacturing machine, wherein the computer-numerically-controlled subtractive manufacturing machine can machine the machined part from the forged part using the compensated mesh model.

12. A non-transitory computer-readable medium encoding instructions operable to cause data processing apparatus to perform operations comprising:
   obtaining a mesh model of a machined part to be machined from a forged part and residual stress field data for the forged part, wherein the mesh model comprises multiple nodes corresponding to at least one boundary of the machined part to be machined from the forged part;
   updating the mesh model for the machined part to be machined from the forged part to generate a compensated mesh model by applying the residual stress field data for the forged part to the multiple nodes corresponding to the at least one boundary of the machined part to be machined from the forged part to change positions of the multiple nodes in the mesh model,
      wherein updating the mesh model for the machined part to be machined from the forged part by applying the residual stress field data for the forged part comprises interpolating the residual stress field data into the mesh model of the machined part;
   repeating the updating until an amount of change to each of the positions of the multiple nodes in the mesh model satisfies a correction criteria for the compensated mesh model;
   determining, from the compensated mesh model, an initial tool path comprising a plurality of sequential sub-paths, including a first sub-path connecting a first node position to a second node position and a second sub-path connecting the second node position to a third node position, and wherein each sub-path of the plurality of sequential sub-paths defines a region of the forged part that is to be removed from the forged part;
   for each sub-path of the plurality of sequential sub-paths of the initial tool path:

determining, from the compensated mesh model and the residual stress field data of the forged part, a respective deflection vector for each node position of the multiple nodes, wherein the deflection vector is a difference between an original position of the node before the sub-path is completed to a deflected position of the node after the sub-path is completed; and generating, a modified sub-path for each subsequent sub-path of the plurality of sequential sub-paths;

generating, a modified tool path from the plurality of modified sub-paths; and providing, the modified tool path for use in machining the machined part from the forged part.

13. The non-transitory computer-readable medium of claim 12, wherein obtaining the mesh model of the machined part to be machined from the forged part comprises:

receiving a computer-aided design model of the machined part to be machined from the forged part; and converting the computer-aided design model into the mesh model.

14. The non-transitory computer-readable medium of claim 13, wherein obtaining the residual stress field data for the forged part further comprises:

receiving residual stress field data calculated for the forged part; and producing a residual stress mesh model from the residual stress field data.

15. The non-transitory computer-readable medium of claim 12, wherein updating the mesh model comprises, for each node of the multiple nodes of the mesh model:

determining a difference vector between a position of the node of the mesh model and a respective changed position of the node after applying the residual stress field data to the mesh model; and updating the position of the node in the mesh model to compensate for the difference vector.

16. The non-transitory computer-readable medium of claim 12, wherein the amount of change to each of the positions of the multiple nodes in the mesh model that satisfies the correction criteria has a magnitude less than a threshold value.

17. The non-transitory computer-readable medium of claim 12, wherein providing the compensated mesh model for use in machining the machined part from the forged part comprises:

producing tool paths for a computer controlled manufacturing system to manufacture the machined part from the forged part, wherein the tool paths are produced from the compensated mesh model or from a CAD model produced from the mesh model.

18. The non-transitory computer-readable medium of claim 12, further comprising, providing the modified tool path to a computer-controlled manufacturing system to manufacture the machined part from the forged part.

19. The non-transitory computer-readable medium of claim 12, wherein determining the deflection vector includes performing a finite element analysis simulation of a machining process using the initial tool path on the forged part.

20. The non-transitory computer-readable medium of claim 12, wherein providing the compensated mesh model for machining of the machined part from the forged part comprises converting the compensated mesh model into a computer-aided design model of the machined part to be machined from the forged part.

\* \* \* \* \*